United States Patent [19]

Barr

[11] Patent Number: 5,389,495
[45] Date of Patent: Feb. 14, 1995

[54] WATERBORNE PHOTORESISTS HAVING NON-IONIC FLUOROCARBON SURFACTANTS

[75] Inventor: Robert K. Barr, Laguna Niguel, Calif.

[73] Assignee: Morton International, Inc., Chicago, Ill.

[21] Appl. No.: 223,615

[22] Filed: Apr. 6, 1994

Related U.S. Application Data

[63] Continuation-in-part of Ser. No. 199,037, Feb. 18, 1994, which is a continuation-in-part of Ser. No. 186,875, Jan. 25, 1994, abandoned.

[51] Int. Cl.$^6$ .............................................. G03C 1/78
[52] U.S. Cl. ..................................... 430/281; 430/906; 430/910; 522/85; 522/110
[58] Field of Search ...................... 430/281, 906, 910; 522/85, 110

[56] References Cited

U.S. PATENT DOCUMENTS 5,045,435  9/1991  Adams et al. ...................... 430/288

OTHER PUBLICATIONS

"Application of fluorochemical sufactants in high-solids and water-borne coatings" Dr. Jeffrey G. Linert & Dr. J. N. Chasman, pp. 37–43 American Paint and Coatings Journal.

*Primary Examiner*—Jack P. Brammer
*Attorney, Agent, or Firm*—Wayne E. Nacker; Gerald K. White

[57] ABSTRACT

A waterborne photoimageable composition or photoresist comprises a latex binder polymer having sufficient carboxylic acid functionality to render it developable in alkaline aqueous solution, a photopolymerizeable monomer fraction, a photoinitiator chemical system and surfactant which is a fluoroaliphatic oxyethylene adduct.

3 Claims, No Drawings

WATERBORNE PHOTORESISTS HAVING NON-IONIC FLUOROCARBON SURFACTANTS

This is a continuation-in-part of application Ser. No. 08/199,037, filed on Feb. 18, 1994, which is a continuation-in-part of Ser. No. 08/186,875, filed Jan. 25, 1994, now abandoned.

The present invention is directed to photoresists, such as those used for forming printed circuit boards and more particularly to waterborne, liquid applied photoresists.

BACKGROUND OF THE INVENTION

Photoimageable compositions useful as resists for forming printed circuits, printing plate, solder masks or the like have been used for some time now. The earliest photoresists were solvent-borne and solvent-developable. The development of aqueous-developable resists represented an advance in reducing solvent emissions in the immediate workplace and in the general environment. The continued emphasis in reducing organic solvent both from the workplace and from the general environment has spurred the search for waterborne photoresists which are formulated and applied as aqueous liquids.

U.S. Pat. No. 5,045,435, the teachings of which are incorporated herein by reference, describes a waterborne photoresist composition which is developable in alkaline aqueous solution. The composition comprises a multifunctional monomer, a photoinitiator and a latex of water-insoluble carboxylated acrylic copolymer. To stabilize the composition and to adjust the viscosity, this patent teaches neutralizing the latex polymer to at least 25% with a base, such as ammonia, another amine, or sodium hydroxide.

A liquid, such as a waterborne photoresist liquid will only wet and spread over a surface if the forces of attraction between the liquid and the substrate are greater than the cohesive forces within the liquid. Accordingly, the surface energy of the liquid must be at or below the surface energy of the substrate. Thus, to coat a copper substrate having a surface energy of 35 dynes/cm, the surface energy of water, which has a surface energy of 72 dynes/cm, must be dropped. This may be accomplished with the aid of a suitable surfactant. A surfactant is a material with both hydrophilic and hydrophobic properties. Surfactants can be divided into three major chemical classes: hydrocarbons, silicones, and fluorochemicals, these designations referring to the hydrophobic portion of the molecule. The hydrophobe is attached to a hydrophilic group which can be anionic, cationic or nonionic in nature.

Applicants have found neither hydrocarbon surfactants nor silicon surfactants to be particularly suitable surfactants in waterborne photoimageable compositions. Although all types of surfactants are found to sufficiently lower surface energy, it is found that hydrocarbon and silicone surfactants encounter problems respect to dewetting of the copper substrate. Dewetting produces voids which result in an unsuitable coating. Furthermore, if the photoimageable composition is intended as a plating resist, silicone from a silicone-based surfactant can leach into the plating solution creating potential bath failure. Of the major classes of surfactants, hydrocarbon based surfactants are found to be the least effective in reducing the surface tension of the liquid and do not produce defect coatings. Furthermore, hydrocarbon based surfactants contribute to the overall volatile organic components (VOCs) in the coating, which is contrary to the purpose of producing waterborne coatings.

Above-referenced U.S. Pat. No. 5,045,435 gives examples wherein fluorocarbon-based surfactants are used in waterborne photoimageable compositions, i.e., those sold under the trademark FLUORAD FC-431 and FC-120. Applicants have found that neither of these performs well. FC-120, which is anionic, wets sufficiently, but produces increased foaming. FC-431 is non-ionic, but is found to be less than suitable in that it does not eliminate all coating defects, regardless of the concentration level.

It is a general object of the present invention to provide a surfactant for waterborne photoimageable compositions which lowers the surface tension sufficiently for coating on a substrate, such as a copper substrates, does not dewet, and does not cause foaming.

SUMMARY OF THE INVENTION

In accordance with the invention, a waterborne photoimageable composition comprises an aqueous composition containing A) between about 30 and about 80 wt % of a latex binder polymer having acid functionality, e.g., carboxylic acid functionality or sulfonic acid functionality, which provides an acid number of between about 50 and about 250, B) between about 15 and about 50 wt % of alpha,beta-ethylenically unsaturated monomer(s), C) between about 0.1 and about 25 wt % of a photoinitiator or photoinitiator chemical system which generates free radicals, D) between about 1 and about 40 wt % of a neutralizing base and/or polyether polyurethane associate thickener in amounts sufficient to stabilize the photoimageable composition as an aqueous emulsion and E), between about 0.3 and about 10 wt. % of a surfactant which is a fluoroaliphatic oxyethylene adduct, the weight percentages being based on total weight of components A–E.

DETAILED DESCRIPTION OF CERTAIN PREFERRED EMBODIMENTS

Latex binder polymers useful in the photoimageable composition of the present invention are typically prepared by emulsion polymerization of alpha, beta-unsaturated monomers, such as vinyl, acrylate or styrene monomers. Sufficient acid functional monomers are used to provide the acid number of between about 50 and about 250, preferably at least about 100. A typical emulsion polymerization procedure and some examples of suitable emulsions are found in U.S. Pat. No. 3,929,743, the teachings of which are incorporated herein by reference. Suitable emulsions can also be obtained commercially, e.g., Neocryl® CL-340 (40% solids) available from ICI Resins U.S. and Acrysol® I-2074 (46% solids) available from Rohm and Haas.

Suitable acid functional monomers for use in forming the acid functional binder polymer have the formulae:

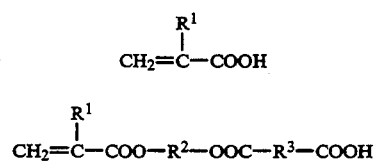

-continued

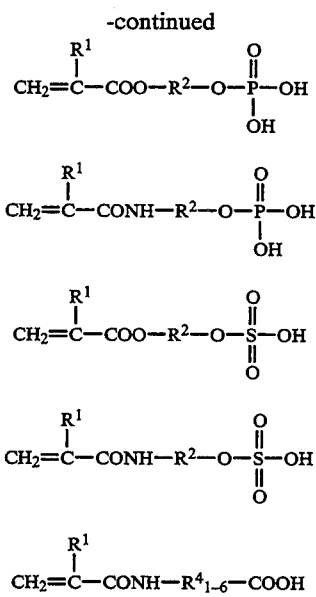

wherein $R^1$ represents a hydrogen atom or a methyl group, $R^2$ represents $(CH_2)_n$ wherein n is an integer of 1 to 6, $R^3$ represents an alkylene group having 1 to 6 carbon atoms or a phenylene group, and the $R^4$s are the same or different and are selected from $CH_2$ and CHOH.

Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

So that the photoimageable composition is contact imageable, i.e., drys to a tack-free state, the glass transition temperature $(T_g)$ of the latex binder polymer is preferably at least about 60° C. as measured by Differential Scanning Calorimetry (DSC) @ 20° min. The polymers have a weight average molecular weight (Mw) of between about 500 and about 200,000 as measured by gel permeation chromatography (GPS) using a polystyrene standard.

To produce the image, this negative-acting photoimageable composition contains photopolymerizeable monomers, particularly alpha,beta-ethylenically unsaturated monomers, including a substantial portion of multi-functional monomers. Useful monomers include those, listed above, used to form the binder polymers. Particularly suitable monomers include multifunctional acrylic monomers, such as tetraethylene glycol diacrylate (TEGDA), trimethylol propane triacrylate (TMPTA), butanediol dimethacrylate (BDDMA) and pentaerythritol triacrylate (PETA). The monomer fraction may include both water-soluble and water-insoluble monomers; however, the monomer fraction should contain a sufficiently high proportion of water-insoluble (having solubilities in water at 20° C. below about 0.3 g/100 ml) monomers, e.g., above about 20 mole percent, so that the monomer fraction, as a whole, is insoluble in water.

To initiate polymerization of the monomers upon exposure to actinic radiation, the photoimageable composition contains an appropriate photoinitiator(s) or photoinitiator chemical system. Suitable photoinitiators include benzoic ethers, benzil ketals, acetophenones, benzophenones and related compounds with amines. Preferred initiators are thioxanthones, e.g., 2-isopropyl thioxanthones, particularly in conjunction with an amine.

In accordance with the invention, the waterborne photoimageable composition in accordance with the invention includes a surfactant which is a fluoroaliphatic oxyethylene adduct. Such surfactants have the general formula:

$CF_3$—$(CF_2)_n$—Y—$X_m$—Z; where n=0 to 20, Y=-$SO_2$—N($C_1$-$C_{10}$alkyl), X=$CH_2$—$CH_2$—O or CH($CH_3$)—$CH_2$—O, m=0 to 20, and Z=$CH_2$—$CH_2$—OH or CH($CH_3$)—$CH_2$—OH.

Stabilization of the emulsion, including binder polymer is required. Emulsion stabilization and may be accomplished by at least partial neutralization with a base, as is taught in above-referenced U.S. Pat. No. 5,045,435. Preferably, as is taught in U.S. patent application Ser. No. 08/199,037 of which this application is a continuation-in-part, stabilization of the emulsion and viscosity adjustment are achieved using a polyether polyurethane associate thickener. Polyether polyurethane thickeners are polymers having at least two hydrophobic segments which are the residues of hydrophobic isocyanates, generally isocyanates having isocyanate functionality of 2 or higher, and at least one hydrophilic polyether segment joining the hydrophobic segments by urethane linkages. The block polymers which act as associate thickener may take a variety of forms including ABA, $(AB)_n$, star polymers and the like. The polyether segments are formed from poly(alkylene oxide) segments, formed from monomers such as propylene oxide and ethylene oxide. To be sufficiently hydrophilic, generally it is necessary that at least about 3 mole percent of the poly(alkylene oxide) segment(s) be ethylene oxide residues. The hydrophobic portion of the isocyanate residue is typically an alkyl, cycloalkyl or aromatic moiety. Polyether polyurethane associate thickeners and their function are described, for example by A. J.

M. Knoef, and H. Slingerland, "Urethane-Based Polymeric Thickeners for Aqueous Coating Systems" *JOCCA*, September 1992, pp 335-338; J. H. Bieleman et al. *Polymers Paint Colour Journal* 1986, V.176(4169) pp. 450-460; and A. J. Whitton and R. E. Van Doren *Polymers Paint Colour Journal* 1991, V.181(4286) pp. 374-377. Particularly suitable polyether polyurethane associate thickeners and their synthesis are described in U.S. Pat. No. 4,079,028 to Emmons et al., the teachings of which are incorporated herein by reference. Suitable polyether polyurethane associate thickeners are also described in U.S. Pat. Nos. 4,426,485 to Hoy et al. and 4,743,698 to Ruffner et al., the teaching of each of which are incorporated herein by reference. Examples of suitable commercially available associate thickeners are DSX1514 (Henkel) and QR708 (Rohm and Haas).

By using the polyether polyurethane associate thickener, less neutralization of the binder polymer latex is required. In some cases no neutralization is required. In other cases, it is desirable to neutralize the binder up to about 20% of the equivalent acid functionality of the binder polymer. Typically base will be added to neutralize at least about 2% of the acid functionality of the binder polymer. Neutralization may be done with ammonia; primary, secondary, or tertiary amines; or hydroxides. Preferred neutralizing bases are hydroxy functional tertiary amines. The addition of associate thickener in place of at lease some of the neutralizer allows for a smoother more uniform coating. The improved coating quality minimizes potential circuit board defects caused by thin spots or pin holes in the coating. In addition, when applied by roller coating, the photoimageable composition with associate thickener produces a smoother coating at lower roller compression. Low roller compression results in extended life of the rubber rollers.

Reducing neutralizers improves chemical resistance of the applied and dried photoimageable composition layer. When ammonia or amine use is reduced, odor is reduced. Associate thickeners reduce viscosity drift of the aqueous photoimageable composition. Even under high shear, viscosity tends to remain stable.

In addition to components A-E listed above, minor amounts (generally less than about 10 wt % total based on the weight of A-E) of conventional additives may be used, including; antifoam agents, antioxidants, dyes, adhesion promoters, slip aids, and other surface tension modifiers.

In a preferred method of preparing the waterborne photoimageable composition of the present invention, those components, such as initiators, antioxidants and dyes, most compatible with a hydrophobic phase are admixed with the monomer fraction to produce a monomer base and those components most compatible with an aqueous phase with the latex polymer, such as antifoam, neutralizer surfactant and associate thickener, are admixed to form a polymer mix. The hydrophobic phase and polymer mix are blended to form an hydrophobic phase-in-water emulsion. Subsequently, high boiling solvents, surfactants, including slip aids, surface tension modifiers, and adhesion promoters are added.

The final water-borne composition is generally between about 20 and about 40 wt. percent solids. In the waterborne composition, the binder comprises between about 10 and about 30 wt %, monomers from about 3 to 20 wt %, initiator from about 0.3 to about 10 wt %, neutralizing base and/or thickener from about 1.5 to about 20 wt %, and fluoroaliphatic oxyethylene adduct surfactant between about 0.06 and about 2 wt %.

The composition may be coated by any of the coating systems known in the art for coating solvent-borne photoimageable compositions, such as roll coating, dip coating, spray coating or curtain coating.

The compositions of the present invention are applied in a conventional manner, either as liquid compositions directly to a metal clad blank laminate or to a polymeric support sheet to form a dry film. After coating, the composition is dried to remove water and also to remove volatiles, such as ammonia or amine, water, etc., thereby rendering the solution polymer insoluble in acidic or neutral aqueous medium. As the photoimageable composition dries, the system coalesces into a continuous film. Drying is preferably carried out at somewhat elevated temperatures, both to hasten removal of the water, and to drive off the ammonia or volatile amine. Preferably, drying is carried out at a temperature of about 90° C.

In forming a dry film, a water-borne composition is applied to flexible support sheet, e.g., polyethylene terephthalate, and then dried to remove water and volatiles. Subsequently, a protective sheet, e.g., polyethylene, is applied to the photoimageable composition layer, and the dry film is rolled into reels. In drying the photoimageable composition layer, it is found desirable in some cases to leave a residual water content of between about 1 and about 2 wt. % (relative to solids of the photoimageable composition layer). This residual water acts to allow the photoimageable composition layer to conform to surface defects of a substrate, e.g., a copper-clad board, when laminated thereto.

Processing is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

Not only can waterborne primary imaging photoresists be provided in accordance with the invention, but solder mask-forming compositions can be provided as well. By solder mask is meant herein a hard, permanent layer which meets at least the minimal requirements of the abrasion resistance tests as defined in IPC-SM-840B, Table 12, Summary of Criteria for Qualification/Conformance (Institute for Interconnecting Circuits). To become hard and permanent, it is generally necessary that the photoimageable composition be curable after exposure, development and processing of the board, e.g., by thermal and/or UV curing. One way to provide a post-cure is to provide binder polymer having free -OH groups in the backbone that may be cured, for example, by cross-linking with aminoplast resins, such as melamine/formaldehyde resins and urea/formaldehyde resins. Alternatively, the photoimageable composition may contain a compatible epoxy resin and a curative for the epoxy resin. It is found that water-borne photoimageable compositions in accordance with the invention exhibit excellent shelf lives after application to copper substrates and can remain on a copper-clad board upwards of several days.

The invention will now be described in greater detail by way of specific examples.

EXAMPLES 1-4

Water-borne photoimageable compositions were formulated according to Table 1 below. Amounts are in grams. 2.3 grams of neutralizer represents about 15% neutralization; 4.5 grams of neutralizer represents about 30% neutralization. Performance data is according to Table 2 below. "Monomer base" in Table 1 is per Table 3; all materials being mixed together, filtered and subsequently added to the aqueous portion.

TABLE 1

| FORMULATION NAME | INGREDIENT TYPE | #1 | #2 | #3 | #4 |
| --- | --- | --- | --- | --- | --- |
| Neocryl CL-340 (40% solids) | polymer | 100.0 | 100.0 | 100.0 | 100.0 |
| DMAMP-80 (Angus) | tertiary amine neutralizer | 0.0 | 0.0 | 2.3 | 0.0 |
| AMP-95 (Angus) | primary amine neutralizer | 0.0 | 0.0 | 0.0 | 2.3 |
| DSX-1514 (Henkel) | associative thickener | 4.5 | 9.0 | 2.3 | 2.3 |
| Deionized Water | primary solvent | 100.0 | 100.0 | 100.0 | 100.0 |
| BYK-033 (BYK/Chemie) | antifoam | 1.0 | 1.0 | 1.0 | 1.0 |
| Monomer Base | see Table #3 | 20.5 | 20.5 | 20.5 | 20.5 |
| Q4-3667 (Dow Corning) | slip aid | 0.45 | 0.45 | 0.45 | 0.45 |
| Fluorad FC170-C (3M) | surface tension modifier | 1.0 | 1.0 | 1.0 | 1.0 |
| Texanol (Eastman) | coalescing solvent | 4.5 | 4.5 | 4.5 | 4.5 |

Neocryl CL-340 is a styrene/acrylic polymer having an acid number of about 160.
Q4-3667 (Dow) is an 80:20 mixture of polyether modified dimethylsiloxanes and cyclodimethylsiloxanes.

TABLE 2

| FORMULATION NAME | #1 | #2 | #3 | #4 |
| --- | --- | --- | --- | --- |
| DMAMP-80 | 0.0 | 0.0 | 2.3 | 0.0 |
| AMP-95 (Angus) | 0.0 | 0.0 | 0.0 | 2.3 |
| DSX-1514 (Henkel) | 4.5 | 9.0 | 2.3 | 2.3 |
| PERFORMANCE RESULTS | | | | |
| Viscosity (initial) | 3500 cps | 5000 cps | 2900 cps | 3200 cps |
| Viscosity (1 week holding) | 3500 cps | 5000 cps | 2700 cps | 2700 cps |
| Odor | none | none | slight fishy | slight ammonia |
| Emulsion Stability | good | very good | fair to good | good |
| Substrate Staining | no stain | no stain | slight stain | slight stain |
| Alkaline Resistance | good | good | fair to good | fair to good |
| Coating Defects | 0 voids/ft 2 | 0 voids/ft 2 | 2 voids/ft 2 | 2 void/ft 2 |
| Coating Uniformity | slight ribbing | no ribbing | moderate ribbing | slight ribbing |
| Developing Time | 29 sec. | 29 sec. | 27 sec. | 28 sec. |
| Photospeed (at 100 mj/cm$^2$) | Copper 8 | Copper 8 | Copper 7 | Copper 7 |
| Circuit Pattern Defects | 1 defect/ft 2 | 0 defects/ft 2 | 3 defects/ft 2 | 4 defects/ft 2 |

DMAMP = 2-dimethylamino-2-methyl-1-propanol; AMP = 2-amino-2-methyl-1-propanol.

TABLE 3

| MONOMER BASE COMPONENTS | COMPONENT TYPE | GRAMS PER FORMULA |
| --- | --- | --- |
| Ethoxylated TMPTA (3 moles ethoxylation) | multi functional acrylate | 17.6 |
| Modaflow | flow additive | 0.05 |
| Antioxidant 2246 | antioxidant | 0.03 |
| Quantacure ITX (thioxanthone) | photosensitizer | 0.59 |
| Quantacure EPD (3° amine) | photoinitiator | 1.49 |
| Baso Blue 688 | background dye | 0.09 |
| Triphenyphosphine | antioxidant | 0.5 |
| Benzotriazole | adhesion promoter | 0.25 |

TMPTA = trimethylol propane triacrylate

PROCESSING CONDITIONS

Coating — Burkle (single sided) Roller Coater, 22 threads per inch
Substrate — Copper Clad
Exposure — HMW OCR, model 301 B, diazo artwork
Development — 1% sodium carbonate monohydrate, 85° F., 2× breakpoint
Etching — 3 normal cupric chloride, 140° F., 1.3×minimum etch
Stripping — 3% sodium hydroxide, 130° F.

PERFORMANCE EXPLANATION

Viscosity — measured on a Brookfield viscometer initially and after one week at 70° F.
Odor — the odor was observed after coating and before drying
Emulsion Stability — Stability was rated based on the overall uniformity of the lacquer mixture
Alkaline Resistance — the resistance was measured after alkaline etch at pH 9.2
Coating Defects — the number of coating voids (thin spots) were counted after roller coating Coating Uniformity — the uniformity was observed immediately after coating Developing Time — twice the amount of time required to remove the unexposed resist Photospeed — using a Stouffer 21 step to measure the last remaining step (each step varies by $\sqrt{2}$) (Note: a higher step would indicate a higher degree of polymerization)

Circuit Pattern Defects — the total number of circuit shorts and opens were measured (Note: the artwork pattern contained 4 mil lines and 4 mil spaces)

|  | No Surfactant Added | + Hydrocarbon Surfactant | + Siloxane Surfactant | + FC120 Anionic Fluorochemical | + FC431 Nonionic Fluorochemical | + FC170 C Nonionic Fluorochemical |
|---|---|---|---|---|---|---|
| Coating Defects | >100 voids/ft 2 | 50 voids/ft 2 | 25 voids/ft 2 | 5 voids/ft 2 | 10 voids/ft 2 | 0 voids |
| Foaming Height* | 10 mm | 7 mm | 7 mm | 35 mm | 10 mm | 10 mm |
| (net affect on foaming) | (—) | (−3 mm) | (−3 mm) | (+25 mm) | (—) | 0 net affect |

*The height of the foaming was measured after 15 min. stirring at 500 rpm

|  | No Surfactant Added | +0.4%** FC-170C | +0.8% FC-170C | +1.5% FC-170C | +3.0% FC-170C | +6.0% FC-170C |
|---|---|---|---|---|---|---|
| Coating Defects | >100 voids/ft 2 | 3 voids/ft 2 | 1 void/ft 2 | 0 voids | 0 voids | 1 voids/ft 2 |
| Foaming Height* | 10 mm | 10 mm | 10 mm | 10 mm | 10 mm | 10 mm |
| (net affect on foaming) | (—) | (—) | (—) | (—) | (—) | (—) |

*The height of the foaming was measured after 15 min. stirring at 500 rpm
**Percentages are based on 100% solids

What is claimed is:

1. A photoimageable composition that can be borne in water comprising
  A) between about 30 and about 80 wt % of a latex binder polymer having carboxylic acid functionality which provides an acid number of between about 50 and about 250;
  B) between about 15 and about 50 wt % of a fraction of alpha,beta-ethylenically unsaturated monomers;
  C) between about 0.1 and about 25 wt % of a photoinitiator or photoinitiator chemical system which generates free radicals;
  D) between about 1 and about 40 wt % of a neutralizing base and/or a polyether polyurethane associate thickener in an amount sufficient to stabilize an emulsion of said latex binder polymer; and,
  E) between about 0.5 and about 3.0 wt % of a surfactant which is a fluoroaliphatic oxyethylene adduct having the formula: $CF_3-(CF_2)_n-Y-X_m-Z$; where $n=0$ to 20, $Y=SO_2-N(C_1-C_{10}alkyl)$, $X=CH_2-CH_2-O$ or $CH(CH_3)-CH_2-O$, $m=0$ to 20, and $Z=CH_2-CH_2-OH$ or $CH(CH_3)-CH_2OH$, said weight percentages being based on total weight of components A–E.

2. The photoimageable composition of claim 1 dispersed in an aqueous medium.

3. A dry film comprising a polymeric support sheet and a layer of the photoimageable composition of claim 1 thereon.

* * * * *

UNITED STATES PATENT AND TRADEMARK OFFICE
CERTIFICATE OF CORRECTION

PATENT NO. : 5,389,495
DATED : February 14, 1995
INVENTOR(S) : Robert K. Barr

It is certified that error appears in the above-indentified patent and that said Letters Patent is hereby corrected as shown below:

Column 9, the following paragraph should be inserted above the first table:
-- Example 5  Various surfactants, including FC170C, in accordance with the invention and other surfactsnts, not in accordance with the invention, were used in a formulation in accordance with Example 1 above.  Foaming and coating defect data is shown in the table. --

Column 9, the following paragraph should be inserted above the second table:
-- Example 6  The formula of Example 1 was coated except that the amount of FC170C was varied:  Foaming and coating defect data is shown in the table below. --

Signed and Sealed this

Twenty-seventh Day of June, 1995

Attest:

BRUCE LEHMAN

*Attesting Officer*     *Commissioner of Patents and Trademarks*